(12) United States Patent
Joshi et al.

(10) Patent No.: US 7,246,343 B2
(45) Date of Patent: Jul. 17, 2007

(54) METHOD FOR CORRECTING POSITION-DEPENDENT DISTORTIONS IN PATTERNING OF INTEGRATED CIRCUITS

(75) Inventors: Devendra Joshi, San Jose, CA (US); Abdurrahman Sezginer, Los Gatos, CA (US); Franz X. Zach, Santa Clara, CA (US)

(73) Assignee: Invarium, Inc., San Jose, CA (US)

( * ) Notice: Subject to any disclaimer, the term of this patent is extended or adjusted under 35 U.S.C. 154(b) by 236 days.

(21) Appl. No.: 10/933,192

(22) Filed: Sep. 1, 2004

(65) Prior Publication Data

US 2006/0048091 A1 Mar. 2, 2006

(51) Int. Cl.
*G06F 17/50* (2006.01)

(52) U.S. Cl. ............... 716/19; 716/4; 716/21

(58) Field of Classification Search ............. None
See application file for complete search history.

(56) References Cited

U.S. PATENT DOCUMENTS

| | | | | |
|---|---|---|---|---|
| 5,008,553 A * | 4/1991 | Abe | ........................ | 250/492.2 |
| 6,249,904 B1 | 6/2001 | Cobb | | |
| 6,289,499 B1 | 9/2001 | Rieger et al. | | |
| 6,301,697 B1 * | 10/2001 | Cobb | ........................ | 716/19 |
| 6,553,559 B2 * | 4/2003 | Liebmann et al. | ........... | 716/19 |
| 6,560,766 B2 | 5/2003 | Pierrat et al. | | |
| 6,611,953 B1 * | 8/2003 | Filseth et al. | .................. | 716/19 |
| 6,665,856 B1 * | 12/2003 | Pierrat et al. | .................. | 716/19 |
| 6,668,367 B2 | 12/2003 | Cobb et al. | | |
| 6,735,752 B2 | 5/2004 | Manoo | | |
| 6,738,859 B2 * | 5/2004 | Liebchen | .................... | 716/19 |
| 6,748,578 B2 | 6/2004 | Cobb | | |
| 7,010,764 B2 * | 3/2006 | Pierrat | .......................... | 716/4 |
| 7,026,082 B2 * | 4/2006 | Eurlings et al. | .............. | 430/30 |
| 7,039,896 B2 * | 5/2006 | Medvedeva et al. | .......... | 716/19 |
| 2002/0073394 A1 * | 6/2002 | Milor et al. | .................. | 716/19 |
| 2005/0160388 A1 * | 7/2005 | Cobb | ............................ | 716/5 |
| 2005/0257187 A1 * | 11/2005 | Gallatin et al. | ............... | 716/21 |
| 2005/0273753 A1 * | 12/2005 | Sezginer | ...................... | 716/21 |

OTHER PUBLICATIONS van de Kerkhof, Mark, et al., "Full Optical Column Characterization of DUV Lithographic Projection Tools," SPIE Proc., vol. 5377, p. 1960-1970, SPIE, Bellingham, WA, 2004.

* cited by examiner

*Primary Examiner*—Leigh M. Garbowski
(74) *Attorney, Agent, or Firm*—Houston Eliseeva LLP

(57) ABSTRACT

A method and system for reducing the computation time required to apply position-dependent corrections to lithography, usually mask, data is disclosed. Optical proximity or process corrections are determined for a few instances of a repeating cluster or object, usually at widely separated locations and then interpolating the corrections to the other instances of the repeating cluster based on their positions in the exposure field. Or, optical proximity corrections can be applied to the repeating cluster of objects for different values of flare intensity, or another parameter of patterning imperfection, such as by calculating the value of the flare at the location of each instance of the repeating cluster, and interpolating the optical proximity corrections to those values of flare.

37 Claims, 6 Drawing Sheets

METHOD FOR CORRECTING POSITION-DEPENDENT DISTORTIONS IN PATTERNING OF INTEGRATED CIRCUITS

BACKGROUND OF THE INVENTION

The process of fabricating integrated circuits typically involves a functional design step, followed by a physical design step. During the functional design step, a design concept is described using a hardware description language and is then converted into a netlist, which specifies the electronic components and the connections between the components. The physical design step specifies the placement of the electrical components or elements on the chip and routing of the connections between the electrical components thereby implementing the netlist. The physical design process generates the physical design data, which are synonymously called layout data, layout, or target layout.

The target layout defines a set of binary patterns or objects, which are also called "features" or "geometric features". Usually the objects are represented as a polygon or collection of polygons in the layout data in order to facilitate the specification of the objects.

Each object can be a part of an electronic component such as a gate of a transistor or a connection between components. Each polygon object has vertices and edges joining the vertices. Each vertex is usually defined by its coordinates in a Cartesian x-y coordinate system. In a typical very-large scale integrated (VLSI) circuit, most edges are parallel to the x or y axis.

Often the physical design data are stored and transmitted in a machine-readable format such as GDSII format, OASIS™ format, or in a database such as OpenAccess database technology or Milkyway™ design database. See, for example, *OpenAccess: The Standard API for Rapid EDA Tool Integration*, 2003 by Si2, Inc; Milkyway Foundation Database for Nanometer Design, Synopsys, Inc. 2003.

In these formats or databases, the layouts are often described hierarchically. This has the advantage of reducing file sizes and improving efficiency for certain changes, since some patterns are placed multiple times in the layout. Repeatedly describing the same structure in detail can be avoided.

In the layout hierarchy, a cell is a subset of the layout pattern that can be referenced as a whole object. Thus, cells can be included in the layout by reference. Inclusions by reference can further be nested.

Often, the hierarchy of the layout resembles a tree. The leaves of a tree are attached to its branches. Branches are attached to larger branches. The hierarchy of branches continues until the trunk of the tree reaches its roots. Leaf cells of a circuit are cells that do not include any cells by reference. A leaf cell comprises a set of objects, which are usually polygons. A child cell is included in its parent cell. A root cell it is not included in any other. A layout can have multiple root cells resembling a forest with multiple trees.

Multiple instances of a cell can be described by a structure reference or an array reference. A structure reference places an instance (a copy) of a cell at a particular (x,y)-offset within a parent cell. Each instance has transformation information, which can often include translation, magnification, reflection, and/or rotation. An array reference describes multiple instances of a cell that are placed on a set of locations that form a grid or array. The array is defined by: 1) a number of rows; 2) a number of columns, 3) row and column spacings, 4) (x,y) offset of an instance; and 5) a set of magnifications, reflections, and rotations that are common to all cells in the array.

If a layout does not have hierarchy, it is called flat. A layout can be flat as per design. Sometimes a hierarchical layout can be flattened. Flattening a layout means removing its hierarchical organization by replacing each cell reference by the set of polygons contained in the cell that is referenced.

Semiconductor device manufacturing comprises many steps of patterning layers according to the layout data. A layer is either the substrate of the semiconductor wafer or a film deposited on the wafer. At some steps, a pattern is etched into a layer. At some other steps, ions are implanted, usually in a pattern, into the layer. Generally, patterning comprises: lithography, and etch or implant.

The prevalent form of lithography is optical projection lithography. This involves first making a mask or reticle that embodies the pattern to be projected onto the wafer. An image of the mask's pattern is then optically projected onto a photoresist film coated on the wafer. This selectively exposes photoresist. The latent image is then developed, thereby making a stencil on the wafer.

Presently, the most common optical lithography projectors are stepper-scanners. These instruments expose a slit shaped region, which is often 26 millimeters (mm)×8 mm on the wafer. The wafer is scanned under the slit by a motorized stage under interferometer control. The mask is scanned in synchronization with the wafer but at a higher speed to account for the reduction of the projector (typically 4x). One scan typically exposes a 26 mm×33 mm image field. Step-and-repeat lithography projectors expose the wafer a field at a time. A common field size here is 22 mm×22 mm. In either case, many exposure fields are needed to cover the wafer.

Other forms of lithography include: mask-less optical projection lithography where the mask is replaced by a spatial light modulator. The spatial modulator is typically an array of micro-machined mirrors that are illuminated and imaged onto the wafer. The spatial light modulator is driven by the lithography data. Direct electron-beam writing lithography; electron projection lithography, and imprint lithography are other forms of lithography.

Field, image field, or exposure field synonymously refer to a region on the wafer and/or a corresponding, optically conjugate region on the mask, if used, where the image on the mask is projected onto the wafer at one static exposure or in one scanning motion. Position in the exposure field is the position of a point on the wafer with respect to coordinate axes fixed on the projection lens, if used, at the beginning of the scanning or stationary exposure by which the point on the wafer is exposed. Lithography data refers to data that are submitted to or otherwise used to specify the mask making process or data that are sent to the spatial modulator of a mask-less lithography instrument.

All patterning processes, however faithful, distort the image to some extent. The pattern that is etched into a layer of the wafer is not an exact scaled replica of the mask or spatial light modulator pattern. The target layout describes the pattern that the designer desires to render on the wafer to form the integrated circuit. It is usually different than the pattern that is actually rendered on the integrated circuit, and is therefore usually very different than the pattern submitted to the mask making process. Thus, the target layout, the lithography or mask data, and the pattern resulting on the wafer are distinct patterns.

Modern semiconductor lithography processes often print features that are smaller than the exposure wavelength. In this regime, which is called the low-$k_1$ regime, the field and wave nature of light is prevalent, and the finite aperture of the projection lens acts as a low-pass filter of spatial frequencies in the image. Thus, it may be difficult for the projection lens to reproduce the high spatial frequency components required to reproduce the sharp edges or corners in polygon objects for example. Also, light entering a mask opening from one object may impact another shape in close proximity, leading to a complex interaction of the electric fields of adjacent objects. Thus, the final shapes that are produced on the wafer will often have rounded corners and may bulge towards adjacent objects in ways that can impact the process yield. This resulting image distortion, called optical proximity effect, is responsible for the most significant distortion that arises in the transfer of the mask pattern onto the wafer.

Optical Proximity Correction (OPC) is the process of changing, or pre-distorting, the mask data so that the pattern that is etched in the wafer is a closer replica of the target layout. The goal of OPC is to counter the distortions caused by the physical patterning process (see A. K-T Wong, Resolution enhancement techniques in optical lithography, SPIE Press, Vol. TT47, Bellingham, Wash., 2001; H. J. Levinson, Principles of Lithography, SPIE Press, Bellingham, Wash., 2001). In effect, the objects or polygons of the lithograph data are modifications from those specified by the target layout in an effort to improve the reproduction of the critical geometry. This is often accomplished by moving object edges and by adding additional objects to the layout.

Different techniques are used to simulate the transformation between the mask pattern and the pattern that is formed in the photo resist. The process for generating the OPC for a given object or mask is typically an iterative process involving moving or adding to the objects, performing a fast simulation to determine if the new objects result in a better resist pattern. In model-based OPC, various process effects are simulated. OPC is a numerically intensive calculation that transforms the target layout into mask data, or more generally, lithography data.

Most prior art OPC algorithms assume that the patterning process is invariant of the location in the imaging field. One approach applies OPC to one representative cell among many instances of the same cell. The same corrections are applied, or copied, to all instances of the cell. This approach ignores position dependent nature of the patterning distortions, however. In reality, the distortion depends on the location in the imaging field because lens aberrations, lens flare, and pupil-illumination have small but perceptible variations across the imaging field. See Mark van der Kerkof, et al, "Full optical column characterization of DUV lithographic projection tools," SPIE Proc. Vol. 5377, p. 1960-1970, SPIE, Bellingham Wash., 2004).

U.S. patent application Ser. No. 10/861,170, filed Jun. 4, 2004, incorporated herein by this reference in its entirety, describes a method by which corrections can be made to the mask data to counter the distortions that depend on the position in the imaging field. Correcting mask data in a position dependent manner can render cells that would otherwise be identical, different. This approach usually applies a different correction to each instance of a repeating cell.

SUMMARY OF THE INVENTION

The present invention concerns a method and system for reducing the computation time required to apply position-dependent corrections to lithography, usually mask, data. This invention also relates to synthesizing mask lithography data or mask-less lithography data so that patterning fidelity is maximized.

The invention is directed toward synthesizing lithography data from a given target layout. Corrections, such as for optical proximity or process effects, are determined for a few instances of a repeating cluster or object, usually at widely separated locations, and then interpolated to the other instances of the repeating cluster based on their positions in the exposure field. Or, optical proximity corrections can be applied to the repeating cluster of objects for different values of flare intensity, or another parameter of patterning imperfection, such as by calculating the value of the flare at the location of each instance of the repeating cluster, and interpolating the optical proximity corrections to those values of flare.

In general, according to one aspect, the invention features a method of correcting for perturbations, such as field position-dependent perturbations as from optical proximity or process effects. The method comprises calculating o corrections. This can involve calculating optical proximity corrections for virtual instances of the object at the first set of positions, such as at corners of the field and a center of the field. The method then determines corrections for positions in a field by interpolating the determined optical proximity corrections.

In one embodiment, the step of calculating the corrections comprises calculating optical proximity corrections for an object at a first set of positions and the step of calculating the optical proximity corrections comprises applying the optical proximity corrections to repeating instances of the object at a second set of positions.

Usually, the object is a collection of shapes representing part of an electrical circuit. Some of the instances of the object can be part of an array reference or structural references.

In one embodiment, the step of calculating optical proximity corrections comprises determining optical proximity corrections for different field positions and the step of calculating the optical proximity corrections comprises interpolating from the optical proximity corrections for the different field positions as a function of field position.

In another embodiment, the step of calculating optical proximity corrections comprises determining optical proximity corrections for different levels of flare or some other perturbing effect, and the step of calculating the optical proximity corrections comprises interpolating the optical proximity corrections as a function of flare or other perturbation in the field. Other perturbations include wavefront aberrations of the projection lens, chromatic aberrations of the projection lens, focus error, map of illumination intensity as a function of direction of incidence, loading of the developer, loading of etching reactants, and re-deposition of reaction products during etch, for example.

In a current embodiment, the step of determining corrections comprises interpolating displacements of edge segments, such as coordinates of polygon vertices. The dimensions and/or positions of objects can also be interpolated. Further, the interpolations can be polynomial, trigonometric, orthogonal polynomial, or spline interpolations. In one example, triangulation from a first set of positions is performed to generate triangular domains in which the first set of positions is at vertices of the triangular domains. Then a linear interpolation is performed within each of the triangular domains for the optical proximity corrections calculated at the vertices.

In general, according to still another aspect, the invention features a computer software product for applying corrections to target data to generate lithography data. The product comprises a computer-readable medium in which program instructions are stored, which instructions, when read by a computer, cause the computer to calculate corrections, such as optical proximity corrections, and then determine corrections in a field by interpolating the calculated corrections.

Finally, the invention can also be characterized as a lithography mask that has been optically corrected for a projection system, the mask comprising a set of repeating objects extending across a field of the mask in which the geometries of the repeating objects have been perturbed relative to each other using an interpolation function to compensate for optical proximity or other effects introduced by the projection system.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

OPC Characteristics

Lens aberrations and the pupil illumination of an imaging system depend on four variables: $(x_p, y_p, x_f, y_f)$. The position in the pupil (the Fourier transform aperture) of the projection lens is $(x_p, y_p)$. The position in the pupil maps to the direction of incidence of a beam on the wafer. The position in the image field is $(x_f, y_f)$. The four-tuple $(x_p, y_p, x_f, y_f)$ uniquely determines the path of a ray through the projection optics.

Lens aberrations, pupil illumination, and flare depend on these four variables in a nontrivial and non-separable manner. A full description of lens flare requires a function of six variables: $(x_p, y_p, x_f, y_f)$ for describing the intended path of the ray and two more variables to describe how the scattered light is distributed to unintended positions in the image field.

Lens aberrations, pupil illumination, and flare are slowly varying functions of the field coordinates $(x_f, y_f)$: To observe significant changes in these measures of lens imperfections, one has to move on the order of millimeters in the image field.

When traditional OPC is performed, a computational model calculates the image formed on a small region of the wafer (a few to tens of micrometers to a side) at a time. The reason the entire image field is not calculated at once is that at 193 nanometers (nm) exposure wavelength, the image field is on the order of $10^5$ wavelengths by $10^5$ wavelengths, which is beyond the reach of present day algorithms and computers.

Within the small computation region, lens aberrations, pupil illumination, and long-range flare can be assumed to be position independent. Short-range flare can be calculated by a shift-invariant operation (convolution with a kernel). OPC in each computation domain can be performed using a local model that does not take into account the variation of the properties of the imaging system with respect to field position. The local model can be changed from one computation domain to the next.

The present invention takes advantage of the slowly varying nature of the lens aberrations, pupil illumination, and flare, or any other field-position dependent perturbations, such as process perturbations, as a function of the field coordinates $(x_f, y_f)$. The goal of the present invention is to avoid calculating corrections for the entire field. Optical proximity and/or other perturbation corrections are calculated for a set number of, usually a few, positions in a field. Then, corrections are determined for other positions in the field by interpolating the calculated optical proximity corrections. This can be achieved by applying position dependent corrections to a few, such as 5, widely separated instances of an object, such as a repeating cluster of polygons, and interpolating the corrections to other instances of the object as a function of field position $(x_f, y_f)$.

Figure 1:
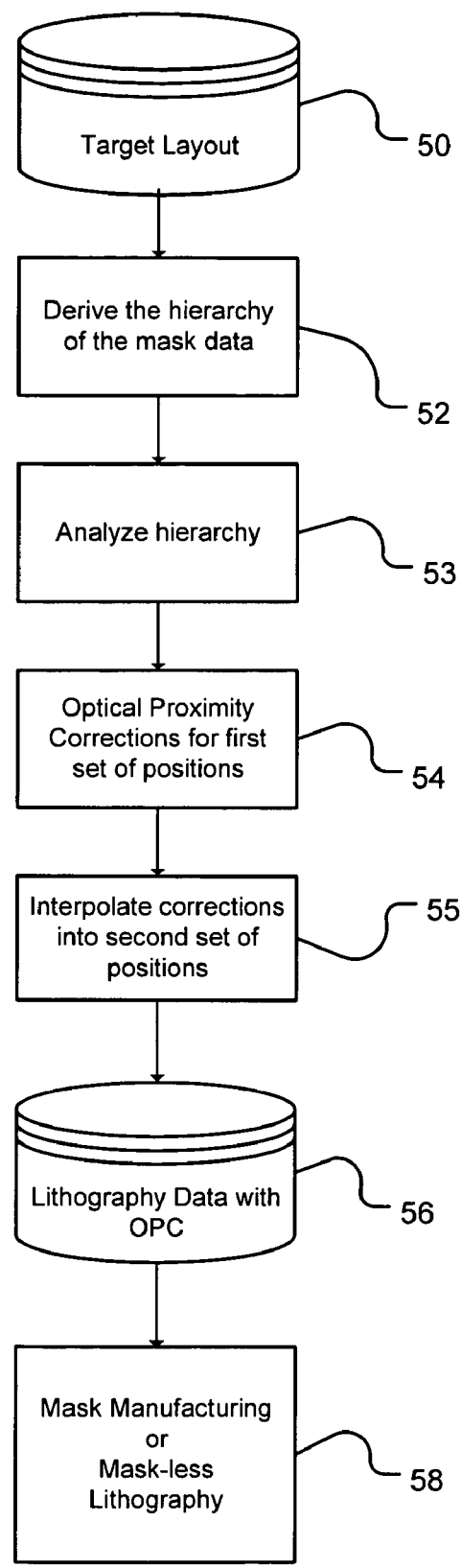
FIG. 1 is a flow diagram illustrating optical proximity or other perturbation corrections according to the present invention.

FIG. 1 shows the OPC process, or more generally, field-position dependent perturbation correction process, according to the principals of the present invention.

Target layout 50 is the end product of the functional design, placement of components, and routing of the connections. It comprises a set of objects, usually a set of polygons, that define each patterned layer of the integrated circuit that is to be rendered according to the functional design.

At step 52, a hierarchy of the mask data is preferably derived from the hierarchy of the target layout and the geometric environment of the cells in the layout. Usually the mask data have less hierarchy than the target layout. This is because repeated objects are distinguished based on patterns within each object's diffraction radius of influence.

The hierarchy is then usually analyzed and possibly modified to identify repeating instances of objects such as repeating clusters of polygons in step 53.

The term repeating cluster denotes a set of polygons that would have self-similar instances (copies) in the mask data (output file) in the absence of field position-dependent patterning effects. A repeating cluster is a set of polygons that is instantiated at more than one location in the exposure field (the set is repeated with translations and possibly rotations), and the set has the following property. Consider polygon p in instance i of repeating cluster c. There is a subset of the layout, $\Omega_{pi}$ that contains polygon p in instance i of repeating cluster c and its neighboring polygons within the range of optical influence. The set c of polygons is a repeating cluster if and only if, for each polygon p in c, $\Omega_{pi}$ are self-similar for all instances i of repeating cluster c. Two sets of polygons are self-similar if and only if the sets become identical when a translation and/or rotation are applied to one of the sets.

According to this definition of repeating cluster, if there are multiple copies of a chip in an exposure field, any subset of the chip layout is a repeating cluster because it repeats as many times as there are chips in an exposure field (possibly with the exception of the subsets of the layout that are in close proximity to stepper alignment marks and test patterns in the scribe lines, which repeat in each field but not in each chip). The unit cell of a memory array is a repeating cluster, except for the cells at or close to the edge of the array. A cell in the hierarchical description of the target layout may or may not be a repeating cluster.

In step 54, OPC and/or other process corrections are determined for repeating objects, such as clusters of polygon, at predetermined, or a first set of positions within the field. Often, the hierarchy information is used at this step in order to identify which objects will the subject of the OPC or other correction. Usually objects that are repeated a large number of times are selected first in order to maximize the propagation of the corrections through the layout. There are a number of options for determining the OPC for these objects.

In rule-based OPC(ROPC), the mask data are determined according to a lookup table of linewidth that will result on the wafer as a function of linewidth and pitch on the mask. ROPC similarly provides predetermined rules for serifs, anti-serifs, and hammerhead features to counter line-end shortening and corner rounding. The rules of ROPC are usually generated by printing a multitude of features and measuring the critical dimensions (CD) of the features that result on the wafer.

In model-based OPC (MOPC), the OPC for the objects is synthesized by solving an optimization problem. The optimization problem minimizes some measure of the difference between the object of the target layout and the pattern that will result on the wafer as predicted by a mathematical model of the patterning process. The location of the edges of polygons, for example, in the mask data are adjusted until the wafer pattern predicted by the model is sufficiently close to the object as prescribed by the target layout.

Optical proximity is not the only process that distorts or perturbs the pattern transferred to the wafer. Mask writing, mask-etch, chemical reaction-diffusion dynamics in the photoresist, and wafer-etch are other processes that contribute to image distortion. It is understood, however, that the computational model of the patterning process can include any or all of these physical processes in the OPC process provided by the present invention.

In step 55, the optical proximity corrections for other positions, such as a second set of positions, in the field are calculated by interpolating the optical proximity corrections determined for the first set of positions OPC. Specifically, the OPC for repeating instances of an object, such as clusters of polygons, calculated for instances at the first set of positions in the field are interpolated to obtain the corrections for instances of the object at a second set of positions in the field. In a preferred embodiment, interpolation is performed with respect to the $(x_f, y_f)$ coordinates of the instances in the field. There are a number of options for determining the OPC for these objects.

Once the OPC is propagated to the repeating objects in the field, the lithography data are written to data storage in step 56 and used to write the mask at step 58, or, in the case of mask-less lithography, used to drive the spatial modulator of the lithography equipment.

Generally, the output lithography data need to go through Mask Data Preparation, MDP, phase for mask writing. MDP primarily fractures the data and converts it to some proprietary data format.

A goal of the present invention is to avoid calculating corrections to each instance of a repeating object or cluster. This can be achieved by calculating position dependent corrections for a few, such as 5, usually widely separated instances of the repeating object and, interpolating the corrections to other instances of the repeating object as a function of field position $(x_f, y_f)$.

Figure 2:
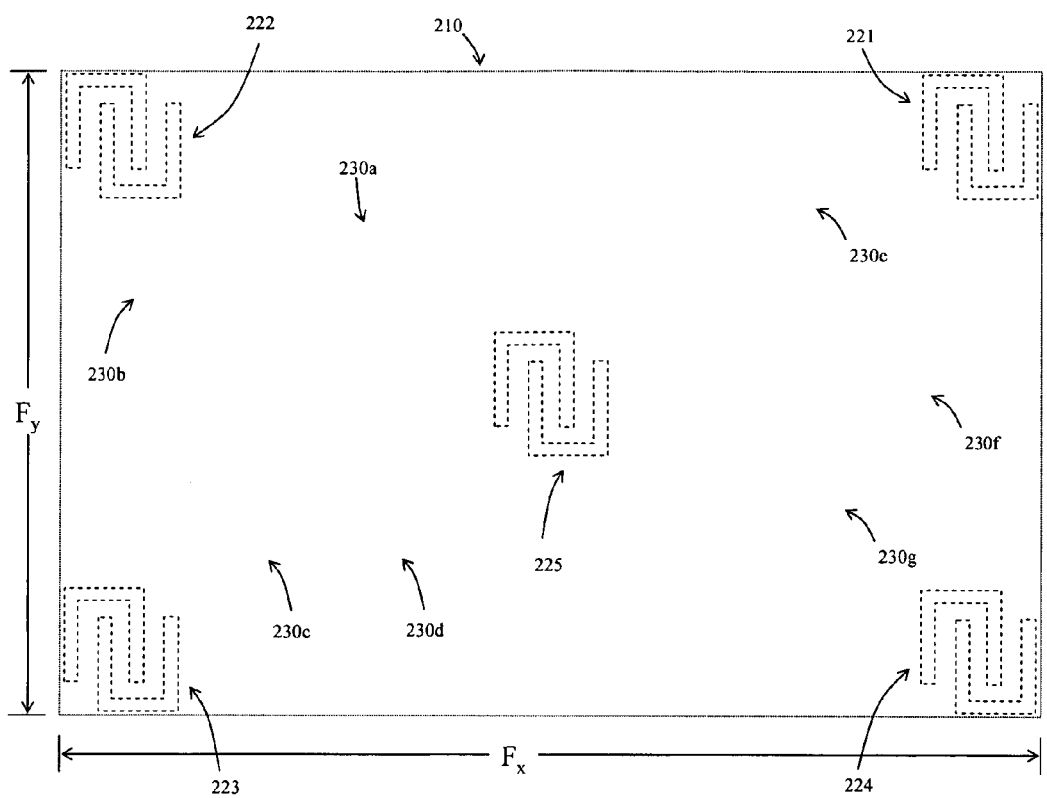
FIG. 2 is a top schematic view of an exposure field illustrating multiple instances of a repeating cluster and its virtual placements at the corners and the center of the exposure field according to the present invention.

FIG. 2 illustrates another approach to determining optical proximity corrections for the first set of positions in the field. The repeating object or cluster is placed at virtual locations, such as at or near the four corners 221, 222, 223, 224 and at or near the center 225 of the exposure field 210.

A virtual instance, which is instantiated at a virtual position 221, 222, 223, 224, 225 in the field 210, is one that is not present in the target layout. A virtual instance is temporarily created for the purpose of calculating OPC at an extreme field position. The corrections are temporarily stored for use in interpolation, but the virtual instances are not included in the output lithography data. In a preferred embodiment, virtual instances are placed at extreme (minimum and maximum) values of x and y-coordinates in the field so that corrections can be interpolated to any location in the field. The purpose of introducing virtual instances is to enable interpolation of corrections to any field location with a minimum number of OPC calculations, and to avoid having to extrapolate corrections.

Position dependent corrections are calculated at the selected virtual locations 221, 222, 223, 224, 225. Corrections that are determined or calculated at the virtual locations are interpolated as a function of field position $(x_f, y_f)$ to obtain the corrections at all instances 230a-g of the repeating cluster. (Only a few instances 230a-g are shown in FIG. 2 for clarity.)

The method of this invention offers a more significant saving if the number of actual instances 230a-g far exceeds the number of instances or locations 221, 222, 223, 224, 225 for which optical proximity corrections are calculated. One embodiment brackets, in x and y directions, all instances of the repeating cluster with a minimal number of OPC calculations.

The center and the corner locations 221, 222, 223, 224, 225 of the exposure field 210 are suitable locations but many other positions are possible for the virtual instances. In this context, center and corners of the field are not limited to exact points. They indicate neighborhoods of radius ⅛ or less of the largest dimension of the field 210.

In another embodiment, the OPC of the repeating object or cluster is determined and corrections calculated by interpolating not only as a function of field position but as a function of flare, lens aberration, or any other optical property that may be position dependent. For example, if the most significant position dependent optical property is flare, OPC of the repeating cluster is calculated for multiple levels of flare. Flare at the location of each instance of the repeating cluster is estimated from a computational model of flare, and the corrections are interpolated to those particular values of flare.

Interpolation of Polygons

The following describes a process for interpolating corrections for objects, specifically, a set of polygons, or corrections to polygons.

A polygon with N vertices can be specified by an array of 2N entries, namely the (x, y) coordinates of its N vertices. An array of 2N numbers is equivalently a vector in $R^{2N}$, the 2N-dimensional Euclidian vector space. A set of M polygons can be specified by an array of $$\sum_{i=1}^{M} 2N_i$$

numbers where the $i^{th}$ polygon has $N_i$ vertices. Therefore, interpolating a repeating cluster of polygons is conceptually no different than interpolating an array. The conceptually simplest way to interpolate an array is to interpolate its entries separately.

A tacit assumption is made: the topology of each instance of the repeating cluster is the same. Each polygon of the repeating cluster has the same number of vertices and edge segments in every instance of the repeating cluster.

In one implementation, the coordinates of the vertices of polygons are interpolated. This approach is not preferred, however, because it can yield edges at arbitrary angles to the x and y-axes. If the angles between the coordinate axes and edges of polygons are not integer multiples of 45°, mask writing can become inefficient.

OPC algorithms typically move segments of edges in the direction that is orthogonal to the edge segment. This approach preserves angles. The edge segments are moved to minimize a measure of difference between the target layout and the wafer pattern predicted by the computational model for pattern transfer.

A variable is assigned to the movement of each edge segment. For example, $\xi_s(x, y)$ is the edge-movement variable for the $s^{th}$ edge segment in a particular repeating cluster. The coordinates (x,y) are the field coordinates of the center of the repeating cluster. The center of the repeating cluster can be defined as the center of the bounding box or the center of mass of the repeating cluster before any corrections are applied to the repeating cluster.

Figure 3:
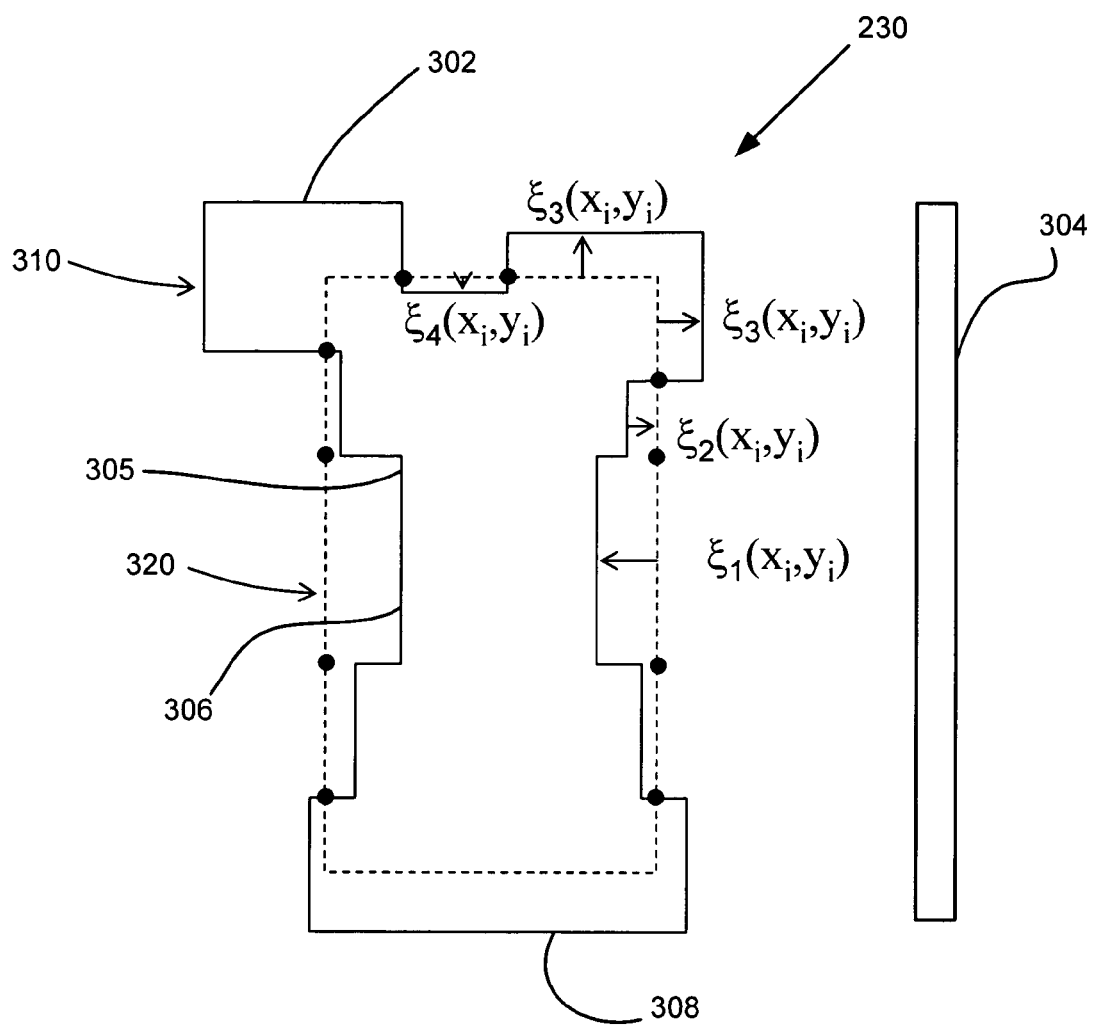
FIG. 3 is a top plan view of a polygon parameterized by edge movements $\xi_s(x_i, y_i)$ according to the present invention.

FIG. 3 shows edge movements $\xi_1(x_i, y_i), \xi_2(x_i, y_i), \xi_3(x_i, y_i), \xi_4(x_i, y_i), \ldots$ for edge segments 1, 2, 3, 4, . . . for the $i^{th}$ instance of a repeating cluster or original polygon 230 of the target data centered at $(x_i, y_i)$. Variables can be assigned to the movements of serifs 302, anti-serifs 305, assist feature 304, bias 306, and hammerheads 308. The position of an edge segment of a polygon in the current iteration of the mask data is preferably measured as a displacement from its initial position 230 or from the target layout.

Figure 4:
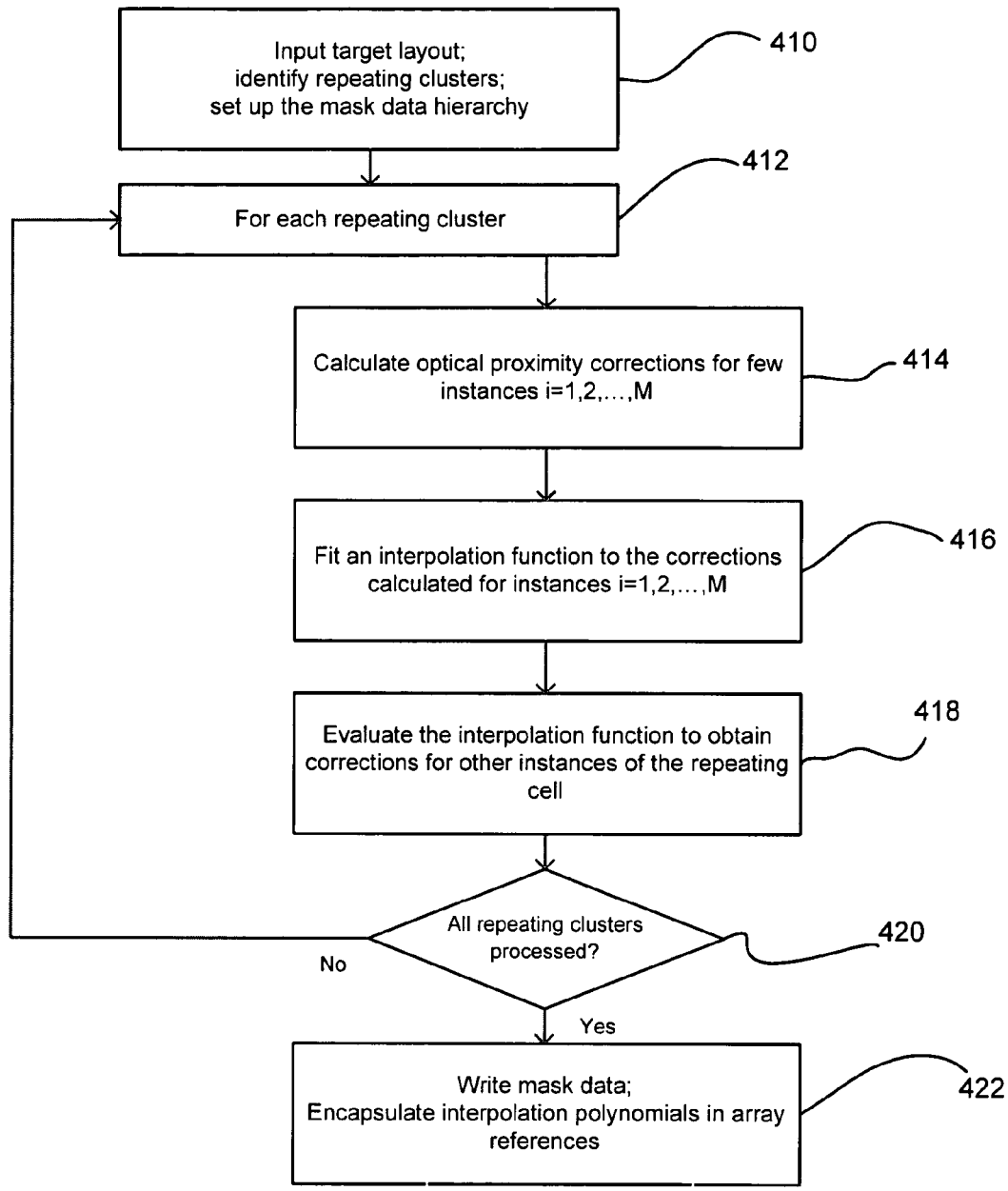
FIG. 4 is a flow diagram illustrating interpolation of optical proximity corrections according to the present invention.

FIG. 4 illustrates a process for interpolation of optical proximity corrections, according to the principals of the present invention.

In step 410, the target layout is read, and repeating objects or clusters in the target layout are identified.

Then for each repeating cluster a serial series of operations are performed according to step 412.

OPC is performed for M instances of a repeating object or cluster c, in step 414. This determination can be made for distributed instances of the object, virtual instances of the object, and/or as a function of optical properties such as flare or lens aberration.

M is a small number such as 5, in a current embodiment. Optical proximity corrections are calculated for each instance i resulting in parameters:

$$\{\xi_{s,i,c}^{(OPC)}|s=1, 2, \ldots S_c; i=1, 2, \ldots, M\} \qquad (1)$$

that specify the corrections to the polygons. The superscript (OPC) indicates that the corrections are determined by optical proximity correction, preferably by a model based optical proximity correction algorithm. The subscript $s=1, 2, \ldots S_c$ label the adjustable parameters, such as edge and serif movements, in repeating cluster c. $S_c$ is the number of adjustable layout parameters of repeating cluster c. The subscripts $i=1,2,\ldots, M$ label the actual or virtual instances of repeating cluster c for which optical proximity corrections are computed.

In step 416, an interpolation function is fit to the set of corrections $\{\xi_{s,i,c}^{(OPC)}|s=1, 2, \ldots S_c; i=1, 2, \ldots,M\}$. The interpolation function can be a linear combination of basis functions $\Phi_{mn}$:

$$\sum_{mn} a_{mn;sc}\Phi_{mn}(x_{i,c}, y_{i,c}) = \xi_{s,i,c}^{(OPC)} \qquad (2)$$

for $i = 1, 2, \ldots, M; s = 1, 2, \ldots, S_c$

The basis functions $\Phi_{mn}$ in Equation (2) are functions of position in the exposure field and/or the basis functions are functions of an optical property such as flare intensity.

Where $(x_{i,c}, y_{i,c})$ are the field coordinates of the center of a repeating cluster, the coefficients $a_{mn;sc}$ are solved from the system of linear equations (2). The system of equations (2) is preferably over-determined and the system is solved for the unknown coefficients $a_{mn;sc}$ in the least squares sense. See Golub, G. H. and Van Loan, C. F., *Matrix Computations*, Sect. 2.5.3 and 2.5.6, 3rd ed. Baltimore, Md.: Johns Hopkins University Press, 1996. Once the set of coefficients $a_{mn;sc}$ are determined, the left hand side of Equation (2) can be calculated at any point in the exposure field. Many different interpolation methods, each with a different set of basis functions $\Phi_{mn}$, are possible:

Full-field polynomial interpolation:

$$\Phi_{mn} = x^m y^n; \ 0 \le x \le F_x; \ 0 < y < F_y; \qquad (3)$$

$F_x$ and $F_y$ are the dimensions of the exposure field.

Full-field trigonometric interpolation:

$$\Phi_{mn} = \cos\left(\frac{\pi m x}{F_x}\right)\cos\left(\frac{\pi n y}{F_y}\right); \ 0 \le x \le F_x; \ 0 \le y \le F_y \qquad (4)$$

Full-field Legendre polynomial interpolation:

$$\Phi_{mn} = P_m\left(\frac{2x - F_x}{F_x}\right)P_n\left(\frac{2y - F_y}{F_y}\right); \ 0 \le x \le F_x; \ 0 \le y \le F_y \qquad (5)$$

Legendre polynomials are complete and orthogonal on the interval [−1,1] (See: W. Abramowitz and I. Stegun, Handbook of Mathematical Functions, Chap. 22, $9^{th}$ printing, Dover, 1972, New York)

B-spline interpolation:

$$\Phi_{mn}^p = B_m^p(x)B_n^p(y) \quad 0 \le x \le F_x; 0 \le y \le F_y \quad (6)$$

$$B_m^0(x) = 1 \text{ if } x_m \le x < x_{m-1}, 0 \text{ otherwise}$$

$$B_m^p(x) = \frac{x - x_{m-1}}{x_{m+p}} B_{m-1}^{p-1}(x) + \frac{x_{m+p+1} - x}{x_{m+p+1} - x_{m+1}} B_{m+1}^{p-1}(x)$$

The integer p is the degree of the B-spline. For p=0, B-spline interpolation becomes piecewise-constant interpolation. For p=1, B-spline interpolation becomes piecewise-linear interpolation. Many other spline functions such as Bezier splines, cubic splines are possible (see Bartels, R. H.; Beatty, J. C.; and Barsky, B. A. *An Introduction to Splines for Use in Computer Graphics and Geometric Modelling*. San Francisco, Calif.: Morgan Kaufmann, 1998) Two dimensional B-splines are interpolated from a product mesh $(0=x_1<x_2< \ldots <x_{N1}=F_x)\times(0=y_1<y_2< \ldots <y_{N_2}=F_y)$ to any point in the exposure field. Optical proximity corrections are calculated for virtual instances of repeating cluster c placed at the $M=N_1\times N_2$ mesh points $(x_m, y_n)$.

Many other interpolation schemes are possible such as Lagrange interpolating polynomial, Newton's divided differences interpolation formula, Gauss' trigonometric interpolation formula (see Handbook of Mathematical Functions, Ed. M. Abramowitz and I. Stegun, Chapter 25, Dover, 1972). Alternatively, the corrected instances can be triangulated according to Delaunay triangulation and the corrections can be linearly interpolated within in each triangle (see griddata function of MATLAB Ver.6.5, 2004, The MathWorks, Inc., 3 Apple Hill Drive, Natick, Mass. 01760, 2004). Similarly, the field can be tessellated with quadrilaterals whose vertices are at the instances of the repeating cluster where optical proximity corrections are calculated. For each quadrilateral, the corrections at its vertices can be bi-linearly interpolated within the quadrilateral using a function of the form (ax+b)(cy+d). The parameters a, b, c, and d are chosen so that the interpolation function equals the corrections at the four vertices of the quadrilateral. Another alternative interpolation scheme chooses virtual instances on a rectangular grid in the field. The corrections are interpolated by taking the 2-dimensional Fourier transform of the corrections in the (x,y) plane preferably using the FFT (fast Fourier transform) algorithm; zero-padding the Fourier transform to create an array of larger size; and inverse Fourier transforming the zero-padded transform.

In step 418, the interpolation function (2) is evaluated at the center $(x_{i,c}, y_{i,c})$ of every instance i of repeating cluster c in the exposure field.

Then, the process is repeated until all clusters have been process as determined in step 420.

The resulting lithograph data, such as mask data, are stored in the output file in step 422.

Figures 5, 6:
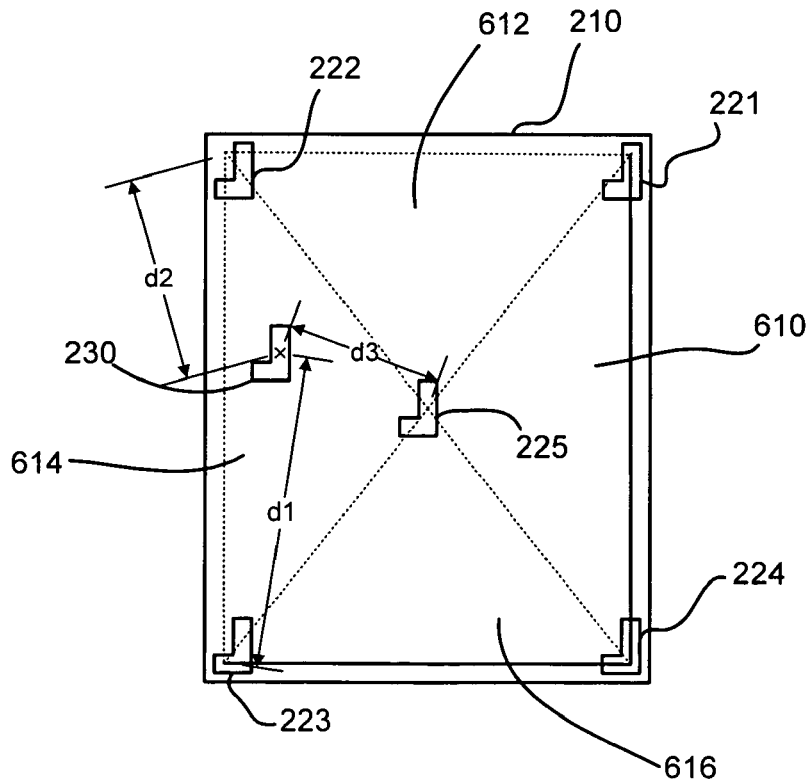
FIG. 5 schematically illustrates an array reference to a cell to which the present invention is applicable.
FIG. 6 is a top schematic view of an exposure field illustrating triangulation from multiple instances of a repeating cluster according to the present invention.

FIG. 5 illustrates an array reference of an object or cell C. The array A has 16 rows and 16 columns. The same cell (set of polygons) is repeated at each of the 256 locations. For example, memory arrays are of this nature. There may be multiple array references in the chip.

In this example, the instances are indexed from lower left to upper right placement. The indexing starts as $C_{0,0}$ at lower left and ends as $C_{15,15}$ at upper right. One or more rows and columns at the edge of the array are subject to proximity effects of the features outside the array. Corrections for these cell instances need to be calculated separately. There is an inner core of the array, say cells from $C_{2,2}$ to $C_{13,13}$, that have identical contents and identical environment.

Absent long range effects and position dependent aberrations, pupil illumination, and flare, cells $C_{2,2}$ to $C_{13,13}$, would be exact copies of each other in the output mask data. Optical proximity corrections can be calculated for $C_{2,2}$, $C_{2,13}$, $C_{13,13}$ and $C_{13,2}$, and an interpolation function can be fitted to these corrections as described by Equations (2) and (3).

FIG. 6 shows the method for calculating optical proximity corrections using a triangulation approach.

Similar to FIG. 2, the repeating object or cluster is evaluated or placed at virtual locations, such as at or near the four corners 221, 222, 223, 224 and at or near the center 225 of the exposure field 210. Position dependent corrections are calculated at the selected virtual locations 221, 222, 223, 224, 225.

Then a triangulation from the first set of positions 221, 222, 223, 224, 225 is performed to generate triangular domains 610, 612, 614, 616. Then, within each triangular domain 610, 612, 614, 616, a linear interpolation is performed based on distance d1, d2, d3 and/or as a function of field position $(x_f, y_f)$ to obtain the corrections at all instance 230 of the repeating cluster.

Figure 7:
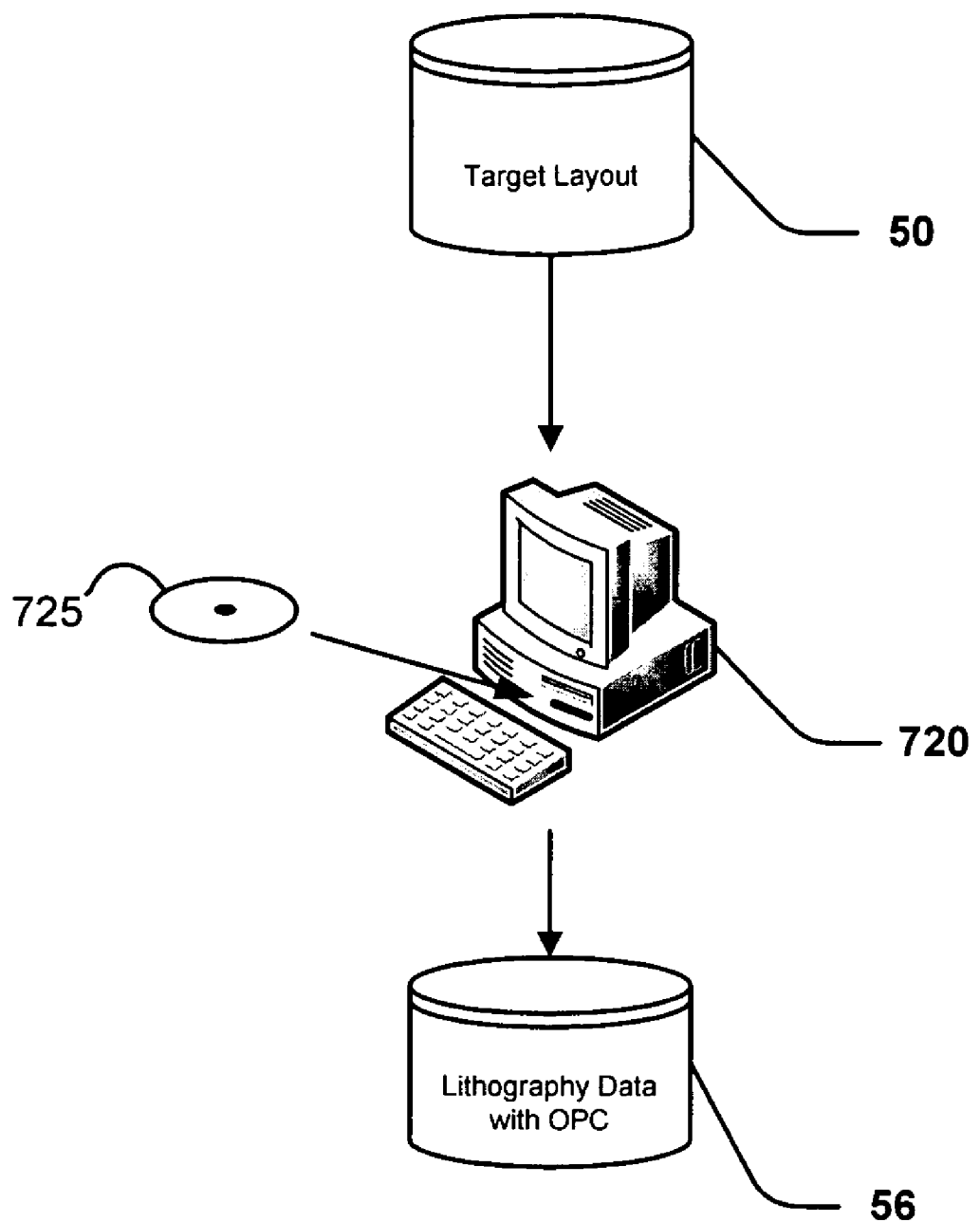
FIG. 7 is a schematic view showing the deployment of the present invention in the process flow for generating a mask, for example.

FIG. 7 illustrates the typical manner in which the present invention is applied to the target data.

The target layout data 50 are stored in a data store such as a storage device or disk drive. The data are then accessed by a compute resource 720, such as a workstation computer. Often, this computer is a multiprocessor/parallel processing computer. These types of computers are required because of the computationally intensive nature of OPC and other perturbation modeling and the size of the target data set.

The computer 720 receives a program implementing the inventive method for correcting position-dependent distortions in patterning of integrated circuits, such as on disk 725.

The resulting optical proximity corrected lithography data 56 are stored in a data storage device. Then, the data are transmitted to and/or accessed by a mask writing tool, which then uses the mask data to generate the mask.

Alternatively, the lithography data are used to drive a direct-write device such as a lithography tool with a spatial light modulation system.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of correcting for perturbations in a lithography process, the method comprising:
    determining corrections for the perturbations by calculating corrections for repeating serif, anti-serif, hammerhead, bias or assist-feature objects; and
    calculating corrections for positions in a field by interpolating the determined corrections for fabrication with a lithography process using the corrections.

2. A method as claimed in claim 1, wherein:
    the step of determining the corrections comprises calculating optical proximity corrections for an object at a first set of positions; and
    the step of calculating the corrections comprises applying optical proximity corrections to repeating instances of the object at a second set of positions.

3. A method as claimed in claim 2, wherein the object is a collection of shapes representing part of an electrical circuit.

4. A method as claimed in claim 2, wherein some of the instances of the object are part of an array reference.

5. A method as claimed in claim 2, wherein some of the instances of the object are structure references.

6. A method as claimed in claim 1, wherein the step of determining the corrections comprises determining corrections for different field positions; and the step of calculating the corrections comprises interpolating from the corrections for the different field positions as a function of field position.

7. A method as claimed in claim 1, wherein the step of determining the corrections comprises determining optical proximity corrections for different levels of flare, and the step of calculating the optical proximity corrections comprises interpolating the optical proximity corrections as a function of flare in the field.

8. A method as claimed in claim 1, wherein the step of determining the corrections comprises determining optical proximity corrections for different levels of lens aberration; and the step of calculating the optical proximity corrections comprises interpolating the optical proximity corrections as a function of lens aberration in the field.

9. A method as claimed in claim 1, wherein the step of determining the corrections comprises determining optical proximity corrections for different levels of focus error; and the step of calculating the optical proximity corrections comprises interpolating the optical proximity corrections as a function of focus error in the field.

10. A method as claimed in claim 1, wherein the step of calculating the corrections comprises interpolating displacements of edge segments.

11. A method as claimed in claim 1, wherein the step of calculating the corrections comprises interpolating coordinates of polygon vertices.

12. A method as claimed in claim 1, wherein the step of calculating the corrections comprises interpolating dimensions of objects.

13. A method as claimed in claim 1, wherein the step of calculating the corrections comprises interpolating positions of objects.

14. A method as claimed in claim 1, wherein the step of calculating the corrections comprises interpolating dimensions and positions of objects.

15. A method as claimed in claim 1, wherein the step of calculating the corrections comprises performing a polynomial interpolation.

16. A method as claimed in claim 1, wherein the step of calculating the corrections comprises performing a trigonometric interpolation.

17. A method as claimed in claim 1, wherein the step of calculating the corrections comprises performing an orthogonal polynomial interpolation.

18. A method as claimed in claim 1, wherein the step of calculating the corrections comprises performing a spline interpolation.

19. A method as claimed in claim 1, wherein the step of determining the corrections comprises minimizing a measure of differences between target layouts and resulting patterns on a wafer as predicted by a computational model.

20. A method as claimed in claim 1, wherein the step of determining corrections comprises determining corrections for field-position dependent perturbations.

21. A method as claimed in claim 20, wherein the field-position dependent perturbations are process variations.

22. A method as claimed in claim 20, wherein the field-position dependent perturbations are optical proximity variations.

23. A method of correcting for perturbations in a lithography process, the method comprising:
  determining corrections for the perturbations in fabrication with the lithography process by calculating optical proximity corrections for virtual instances of an object at a first set of positions in a field; and
  calculating optical proximity corrections and applying the optical proximity corrections to repeating instances of the object at a second set of positions in the field by interpolating the proximity corrections for the virtual instances of the object at the first set of positions.

24. A method as claimed in claim 23, wherein the virtual instances are near corners of the field.

25. A method as claimed in claim 23, wherein the virtual instances are at corners of the field and a center of the field.

26. A method as claimed in claim 23, wherein the step of calculating the corrections comprises calculating corrections for repeating serif, anti-serif, hammerhead, bias or assist-feature objects.

27. A method of correcting for perturbations in a lithography process, the method comprising:
  determining corrections for the perturbations; and
  calculating corrections for positions in a field by interpolating the determined corrections for fabrication with a lithography process using the corrections, wherein the step of calculating the corrections comprises: triangulating from a first set of positions to generate triangular domains in which the first set of positions are at vertices of the triangular domains; and linearly interpolating within each of the triangular domains corrections calculated at the vertices.

28. A method of correcting for perturbations in a lithography process, the method comprising:
  determining corrections for the perturbations by looking up shapes that will result on a wafer as a function of shapes specified by a target layout; and
  calculating corrections for positions in a field by interpolating the determined corrections for fabrication with a lithography process using the corrections.

29. A computer software product for applying perturbation correction to target data to generate lithography data, the product comprising a computer-readable medium in which program instructions are stored, which instructions, when read by a computer, cause the computer to determine corrections for field-position dependent perturbations for virtual instances of an object at a first set of positions in a field and calculate corrections in the field by interpolating the determined corrections, which are used in a lithography fabrication process, the corrections being applied to repeating instances of the object at a second set of positions.

30. A software product as claimed in claim 29, wherein the corrections are determined for the second set by interpolating as a function of field position.

31. A software product as claimed in claim 29, wherein the corrections are optical proximity corrections that are determined for the second set by interpolating as a function of flare.

32. A software product as claimed in claim 29, wherein the corrections are optical proximity corrections that are determined for the second set by interpolating as a function of lens aberration.

33. A software product as claimed in claim 29, wherein the corrections are optical proximity corrections that are determined for the second set by interpolating as a function of focus error.

34. A system of correcting for perturbations in a lithography process, the system comprising:
   a datastore for storing a target layout; and
   a compute resource for determining corrections for the perturbations in the lithography process by calculating optical proximity corrections for virtual instances of an object at a first set of positions and deriving lithography data from the target layout by calculating corrections for positions in a field by interpolating the determined corrections and applying the corrections to repeating instances of the object at a second set of positions.

35. A system as claimed in claim 34, wherein the object is a collection of shapes representing part of an electrical circuit.

36. A system as claimed in claim 34 wherein the virtual instances are at corners of the field and a center of the field.

37. A system as claimed in claim 34, wherein the compute resource determines corrections for field-position dependent perturbations.

* * * * *